United States Patent [19]

Malgouires

[11] Patent Number: 5,600,542
[45] Date of Patent: Feb. 4, 1997

[54] MODULAR AUTOMATION DEVICE WITH A LOCKING MEMBER

[75] Inventor: Pascal Malgouires, Cannes la Boca, France

[73] Assignee: AEG Schneider Automation, Sophia Antipolis, France

[21] Appl. No.: 433,964

[22] Filed: May 4, 1995

[30] Foreign Application Priority Data

May 6, 1994 [FR] France ................... 94 05713

[51] Int. Cl.$^6$ .......... H05K 5/00; H01R 13/629; H01R 13/62
[52] U.S. Cl. .......... 361/732; 361/747; 439/157; 439/377
[58] Field of Search .......... 361/732, 740, 361/747, 754, 755, 759, 798, 801; 439/61, 152, 153, 155, 157, 304, 325, 327, 328, 331, 345, 374, 377; 312/223.1, 223.2, 333, 334.16, 334.36

[56] References Cited

U.S. PATENT DOCUMENTS

| | | | |
|---|---|---|---|
| 4,821,146 | 4/1989 | Behrens et al. | 361/759 |
| 5,077,722 | 12/1991 | Geist et al. | 361/732 |
| 5,332,306 | 7/1994 | Babb et al. | 439/377 |

FOREIGN PATENT DOCUMENTS

| | | |
|---|---|---|
| 1262383 | 3/1968 | Germany . |
| 2115062 | 9/1983 | United Kingdom . |

*Primary Examiner*—Donald Sparks
*Attorney, Agent, or Firm*—Oblon, Spivak, McClelland, Maier & Neustadt, P.C.

[57] ABSTRACT

Modular automation device including a compartmented chassis which delimits an internal volume and accommodates a plurality of interface modules. Each module can be locked by a lateral pivoting lever which is journaled on one of its side walls and which cooperates with a fixed locking member on a vertical partition of its compartment. Alternatively, the lever can be journaled on a side wall of the vertical partition with the locking member located on the module.

12 Claims, 3 Drawing Sheets

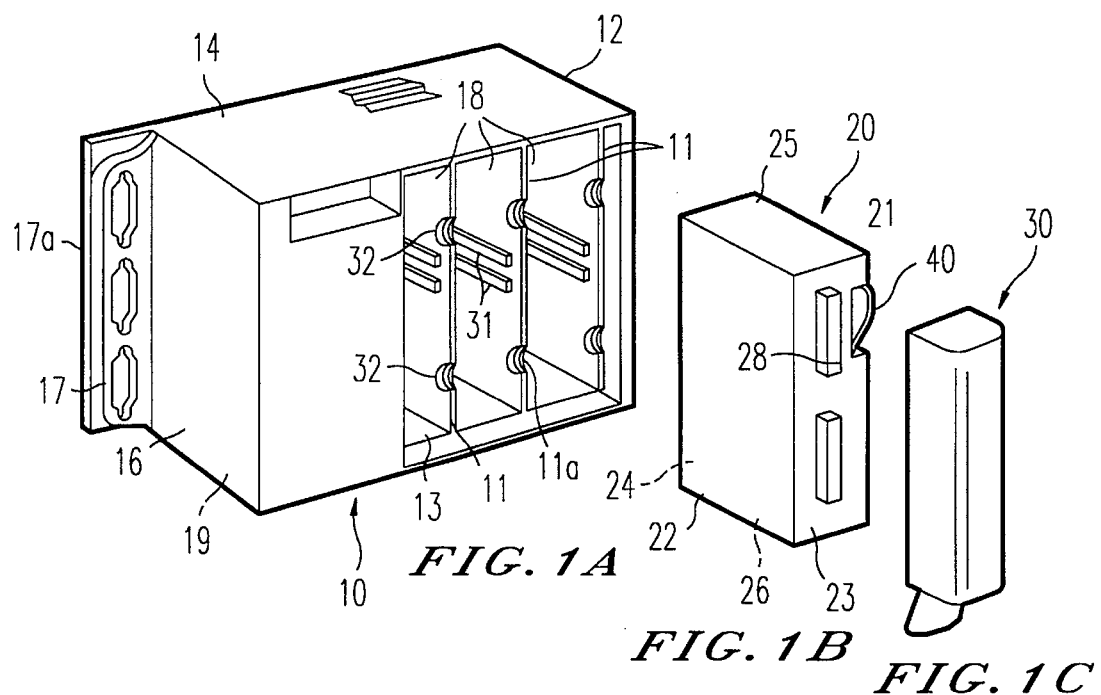
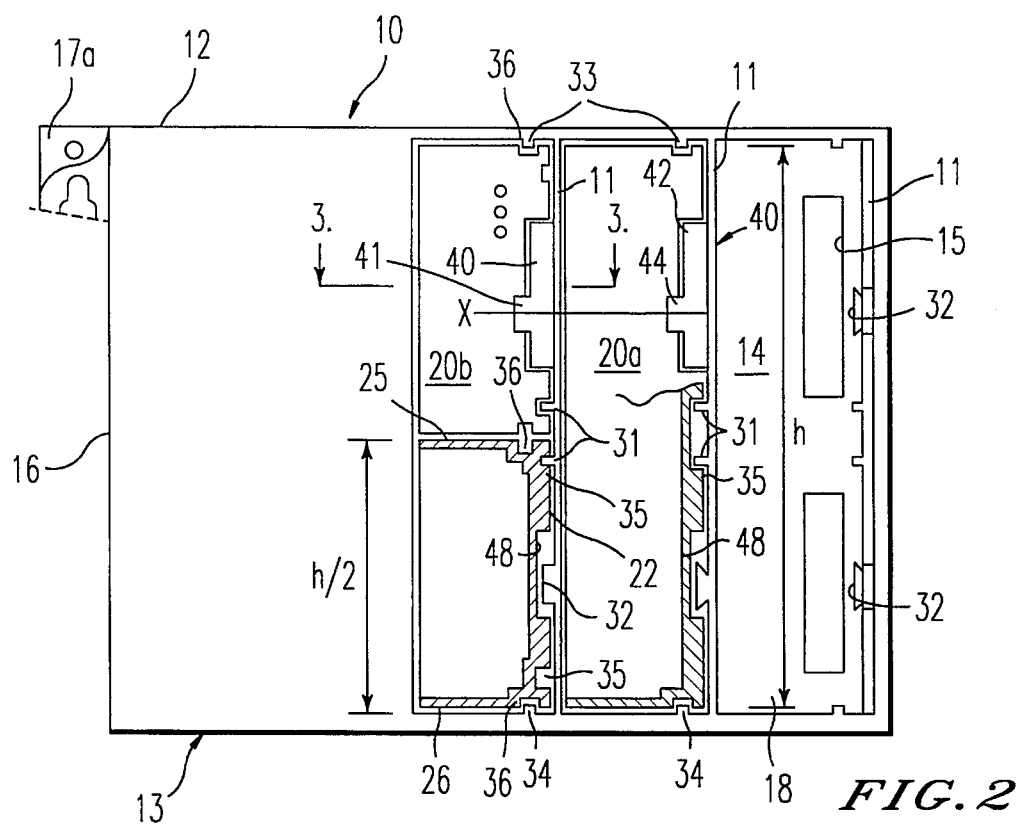

5,600,542

MODULAR AUTOMATION DEVICE WITH A LOCKING MEMBER

BACKGROUND OF THE INVENTION

1. Field of the Invention

The present invention concerns a modular automation device, in particular a programmable controller, comprising a chassis with horizontal and vertical walls which delimit an internal volume equipped with rectilinear guide members, a plurality of functional modules provided at the rear of the connector and at the front with a connector or a terminal block, each module being adapted to be inserted in the internal volume of the chassis by means of guide members and to be immobilized in a connection position by a locking member.

2. Discussion of the Background

Many such devices exist already. It is desirable firstly to assure perfect locking of the functional modules into the chassis to withstand vibration, especially in an industrial environment, while retaining a compact overall size of the device. Secondly, it would be useful to be able to house in the chassis, while keeping the latter very simple, functional modules occupying either all of its height or only half of its height.

SUMMARY OF THE INVENTION

An object of the invention is to satisfy these requirements by means of an appropriate structure of the device.

In accordance with the invention, the internal volume of the chassis is divided into compartments separated by vertical partitions and each accommodating one module or two modules, a locking which comprises a flat lever adapted to pivot on a journal attached to a side wall of the module—or on a vertical partition of the chassis—between an unlocked position and a locked position, each vertical partition—or side wall—comprising a fixed locking member projecting slightly towards the interior of the compartment, the locking lever cooperating with the locking member in the manner of a cam up to the locked position.

The following description is given with reference to the appended drawing in order to explain the characteristic features and the results achieved by the invention:

FIGS. 1A, 1B and 1C are a perspective view of a programmable controller chassis in accordance with the invention;

FIG. 2 is a diagrammatic front view of the programmable controller from FIG. 1;

DESCRIPTION OF THE PREFERRED EMBODIMENT

Figure 3:
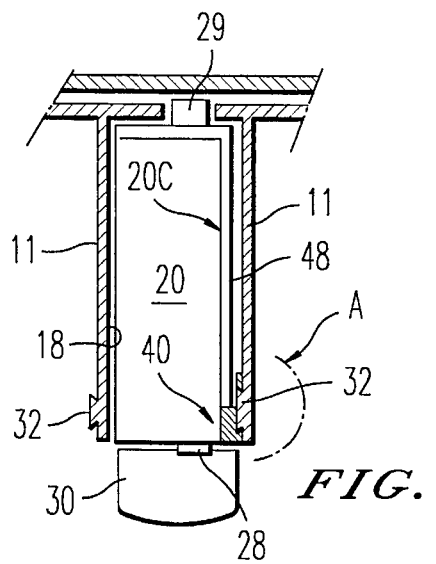
FIG. 3 is a view of an interface module in section taken along line 3—3.
Figure 8:
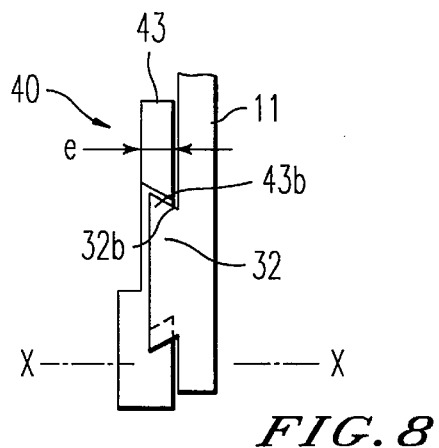
FIG. 8 shows part A of FIG. 3 taken on a larger scale.

The programmable controller shown in FIGS. 1 and 2 comprises a chassis 10 molded from insulative material and having vertical partitions 11, a horizontal top wall 12 and a horizontal bottom wall 13 with cooling slots, and a vertical rear wall 14 with openings 15 for rear connectors of the modules. Side walls 16 have cut-outs 17 for connectors. Screens can be added onto or into the chassis; in particular, a backplate 17a can be attached to the rear of the chassis to provide a ground connection member and a member for fixing the chassis to a support.

The chassis 10 defines an internal volume divided by vertical partitions 11 into modular compartments 18 each adapted to accommodate either an interface functional module 20a of height h, referred to hereinafter as a "large module", or two functional interface modules 20b the height of which is substantially equal to h/2, referred to hereinafter as "small modules"; a large module and a small module are respectively shown in the center and on the right of FIG. 2. The chassis 10 also comprises to one side of the compartments 18 a compartment 19 for a processor and/or power supply unit.

The interface modules 20 comprise parallelepiped-shape casings 21 having vertical side walls 22, vertical front and rear walls 23 and 24 and horizontal top and bottom walls 25, 28. They house at least one printed circuit having a front connector 28 at the front and a rear connector 29 at the rear. The front connector is adapted to connect to a wiring terminal block 30 which is fixed from the front against the wall 23 of the module casings and the conductors of which are connected to external units of an automated system or machine controlled by the automatic controller; the rear connector is adapted to connect to a complementary fixed connector on a rear interconnect bus or printed circuit via the openings 15.

Each vertical partition 11 between two compartments has an even number of (for example: 2) horizontal guide ribs 31 on one side, to guide the large modules 20a or the small modules 20b; it has on the same side a molded-in fixed locking member 32 constituting a cam in the shape of a kidney bean, the function of which is explained below. It goes without saying that the members 31, 32 can be provided on both sides of the partition.

The horizontal walls 12, 13 of the chassis include at least one guide rib 33, 34 for the interface modules in each compartment.

Each interface module comprises, projecting from its vertical wall 22 adjacent the partition 11, at least one groove 35 cooperating with an associated guide rib 31 and, projecting from its horizontal walls 25, 26, at least one groove 36 cooperating with an associated guide rib 33, 34. The ribs and grooves can naturally be interchanged.

Note that there is no horizontal partition in the chassis between two small modules 20b housed one above the other in the same compartment.

To avoid the need to fix each module to the chassis by fixing means such as screws, the vertical side wall 22 of the casing 21 of the module has a locking lever 40 at the side adapted to cooperate with the fixed locking cam 32 molded into the partition 11.

Figure 7:
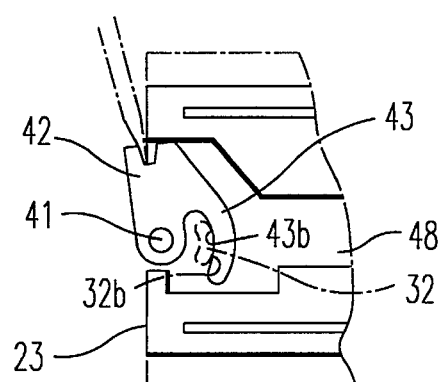

The lever 40 pivots on a journal 41 having a horizontal axis X and connected to a side wall 22 of the casing 21 of the module. The axis X is substantially at the level of the middle of the rear connector 29. The lever is a plastics material component pivoting on a metal envelope 20c which forms a ground plane, comprises the walls 22 and 24 and is L-shape in plan view (FIG. 3). The lever is flat, i.e. its thickness is small compared to the width of the compartment 18. It has a front operating arm 42 provided with a notch 42a to receive the end of the tool for operating it, a rear attachment arm 43 which is hook-shaped and a central bearing part 44. Near and towards the central part 44, the attachment arm is flanked by a curved notch 45 the shape of which is adapted to procure positive clamping and to resist vibration of the lever on the cam 32. To move the module towards the partition 11, especially when the guide and locking members 31, 32 are provided on only one side of the partition, an inside edge 43b of the arm 43 towards the notch 45 has an appropriately oriented cut-out or slope, and likewise the corresponding edge 32b of the cam 32 (FIG. 7).

Note that the attachment arm 43 is thinner than the operating arm 42; in particular, its lateral thickness e is small and substantially equal to that of the fixed cam 32, so that it locates in a slightly recessed space 48 in the side wall 22 of the module; this recessed space 48 comprises a horizontal land 48a at the rear for the fixed cam 32 and a vertical land 48b at the front for the attachment arm.

When the terminal block 30 is assembled to the module, it conceals its front face 23 and in particular blocks access to the operating arm 42 of the locking lever 40 (FIG. 2); this prevents extraction of the module when powered up.

A concave recess 11a is provided on the front edge of each partition 11 at the level of the locking member 32, to accommodate the central part 44 of the lever which is thicker than its attachment arm 43.

Figure 4:
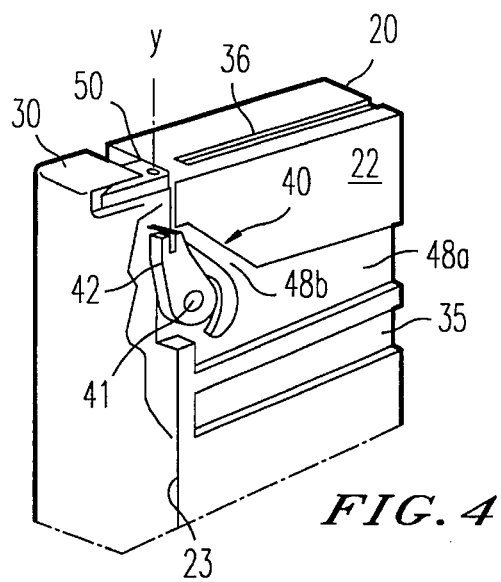
FIG. 4 is a front perspective view of a large module fitted with a wiring terminal block.
Figure 5:
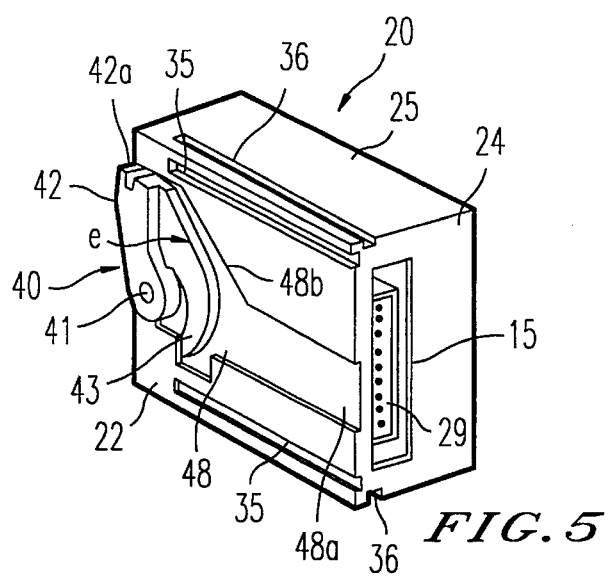
FIG. 5 is a rear perspective view of a small module.

The wiring terminal block is fixed to the interface module casing 11 by one or two screws and/or by nesting or snap-fastener means. Alternatively (FIG. 4), an extractor lever 50 can be provided; this lever is associated with the terminal block—or with the module—and bears on the front face 23 of the module—or on a rear face of the terminal block—and pivots about an axis Y to retract the terminal block.

Figure 6:
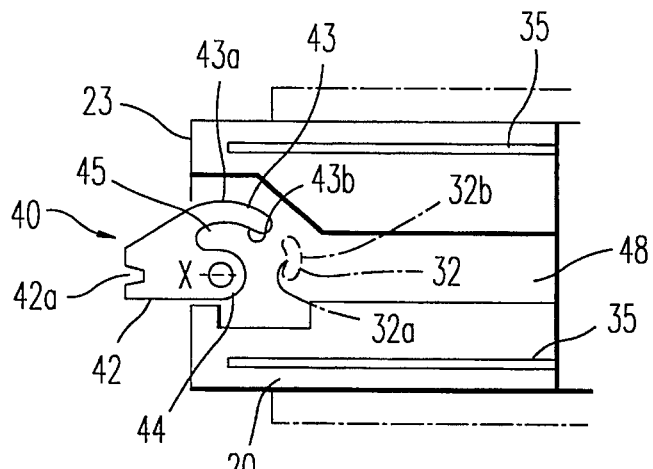
FIG. 6 and 7 are side views in section of a module respectively in an insertion position and in a locked position.

The interface modules are mounted in the chassis in the manner now described with reference to FIGS. 6 and 7.

The module 20 is offered up in front of the chassis 10 for insertion into the latter by movement in translation. The side grooves and top and/or bottom grooves 35, 36 of the module casing are fitted over the corresponding ribs 31 (on the vertical partition 11 of the chassis) and 33, 34 (on the horizontal walls 12, 13 of the chassis). The recessed horizontal land 48a of the side wall 22 of the module accommodates the fixed cam 32 as the module slides in. The locking lever 40 is placed manually in the unlocked position shown in FIG. 6. If this is overlooked, the outside rear edge 43a of its attachment arm 43 abuts against the concave front face 32a of the cam 32 which pivots the lever towards its unlocked position.

To achieve a reliable and vibration-resistant connection between the rear connector 29 of the module and the fixed bus connector, the operating arm 42 of the lever 40 is pushed so that the lever pivots towards its locked position shown in FIGS. 7. The concave inside edge 43b of the attachment arm 43 of the lever engages against the convex rear face 32b of the fixed cam 32. The shape of the concave edge 43b, cooperating with that of the convex face 32b, enhances the clamping of the module casing.

To unlock the module casing the end of a tool is inserted into the notch 42a on the operating arm 42 of the lever to pivot the latter counterclockwise (FIG. 7) into its unlocked position, after which the module is extracted from the chassis.

The large module 20a has a central lateral groove 35 (or two such central grooves) adapted to slide on the pair of central ribs 31 provided for sliding of the bottom lateral groove and top lateral groove 35, respectively, of two small modules 20b accommodated in the same compartment 18.

In a less advantageous embodiment of the invention each pivoting lever can be mounted on a vertical partition of the chassis, the corresponding locking member being provided on a vertical wall of the module. The lever can naturally be mounted on an insulative side wall of the module.

Figure 9:
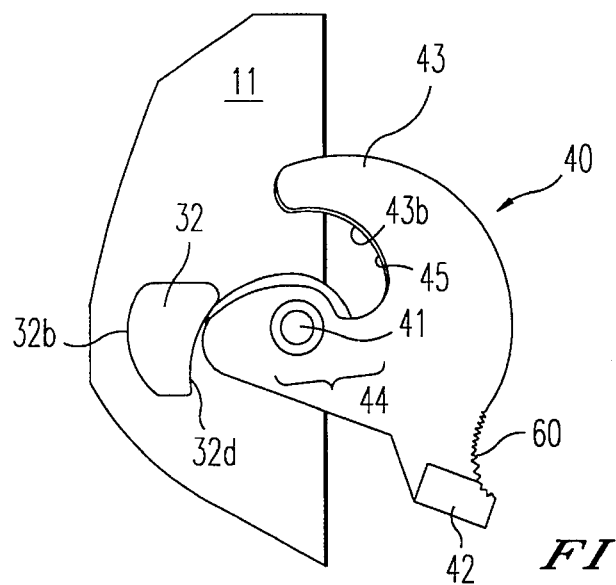
FIGS. 9 through 11 are side views of a preferred embodiment of the locking lever.
Figure 10:
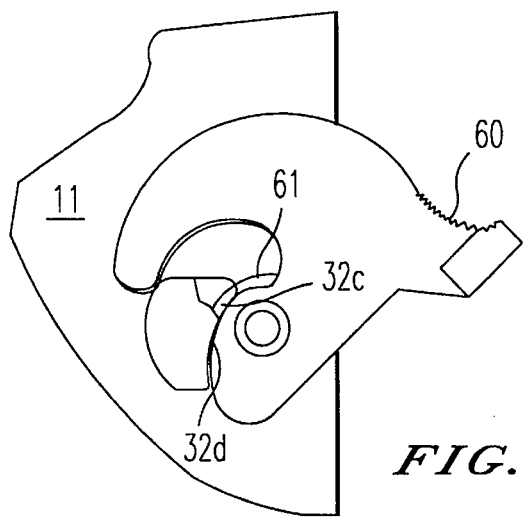
Figure 11:
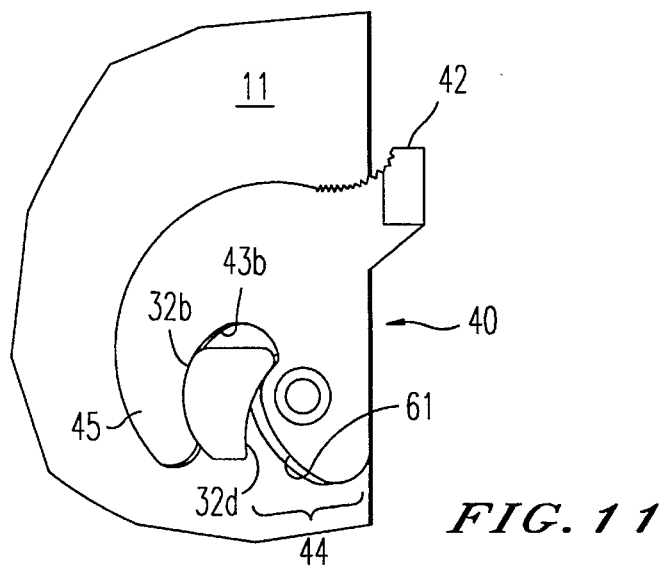

In the embodiment of the invention shown in FIGS. 9 through 11 the locking lever 40 has between the operating arm 42 and the attachment arm 43 a concave area 60 which is knurled or striated so that it is easier for the user to depress. If further comprises, on the side of its central part 44 flanking the curved notch 45, a convex rib 61 cooperating with a concave groove 32c in the concave front edge 32d of the fixed cam 32. The lever 40 is shown in its unlocked position (FIG. 9), engagement or extraction position (FIG. 10) and locked position (FIG. 11); the module is extracted by virtue of the shape of the rib 61 and the groove 32c when the operator pivots the lever clockwise from the FIG. 11 position to the FIG. 9 position.

I claim:

1. Modular automation device, comprising:
   a chassis which has horizontal and vertical walls and which delimits an internal volume fitted with rectilinear guide members,
   a plurality of modules provided at a rear portion thereof with a connector and at a front portion thereof with one of a connector and a terminal block, each having a locking member and said modules being insertable into the internal volume of the chassis by the guide members, each said modules being immobilized in a connection position by said locking member, wherein:
   the internal volume of the chassis is divided into compartments separated by vertical partitions and accommodating at least one of said modules,
   the locking member comprises a flat lever pivoted on a journal attached to one of a side wall of the module and one of said vertical partitions, said flat lever being pivoted between an unlocked position and a locked position, and
   said one of said vertical partitions and said side wall comprises a fixed locking member projecting towards an interior portion of the compartment, the flat lever cooperating with the fixed locking member as a cam up to the locked position wherein a recess is located in one of a side portion of the module and the side wall and within which the flat lever is both located and pivoted so as to cooperate with the fixed locking member.

2. Device according to claim 1 wherein the flat lever and the fixed locking member are shaped so as to move the side wall of the module towards the partition of the chassis.

3. Device according to claim 1 wherein the number and the disposition of the guide members are determined for undifferentiated insertion of one of a single functional module of the modules and two half-height functional modules of the modules into each compartment.

4. Device according to claim 1 which comprises a wiring terminal block fixed to a front wall of a casing of the module, the terminal block concealing access to the locking lever.

5. Device according to claim 1 wherein the flat lever comprises an attachment arm mounting the lever into the unlocked position by abutting against the fixed locking member upon inserting of the module into the compartment with the flat lever in the locked position.

6. Device according to claim 1 wherein the flat lever has an operating art and an attachment arm, the attachment arm being thinner than the operating arm.

7. Automation device according to claim 1 wherein the fixed locking member is molded in one piece and wherein the vertical partitions separate the compartments.

8. Automation device according to claim 1 wherein the side wall of the module on which the flat lever pivots comprises a metal wall.

9. Automation device according to claim 1 wherein the flat lever has a convex rib cooperating with a concave groove located on the locking member and facilitating extraction of the module.

10. Automation device, comprising
- a chassis which has horizontal and vertical walls and which delimits an internal volume fitted with rectilinear guide members,
- a plurality of functional modules each having a locking member provided at a rear portion with a connector and at a front portion with a terminal block, each module being insertable into the internal volume of the chassis by said guide members and immobilized in a connection position by said locking member, wherein:
- an internal volume of the chassis is divided into compartments separated by vertical partitions and each of said components accommodating at least one of said modules,
- the number and disposition of the guide members are determined for undifferentiated insertion of one of a single functional module and two half-height functional modules into each compartment, and
- each vertical partition comprises two locking members projecting towards the interior of the compartment and cooperating with a respective locking lever mounted on a respective module wherein a recess is located in one of a side portion of the module and the partition wall and within which the flat lever is both located and pivoted and cooperates with the locking lever.

11. Modular automation device comprising:
- a chassis which has horizontal and vertical walls and which delimits an internal volume fitted with rectilinear guide members,
- a plurality of module provided at a rear portion thereof with a connector and at a front portion thereof with one of a connector and a terminal block, having a locking member and said modules being insertable into the internal volume of the chassis by the guide members, each of said modules being immobilized in a connection position by said locking member, wherein:
- the internal volume of the chassis is divided into compartments separated by vertical partitions and each accommodating at least one of said modules,
- the locking member comprises a flat lever pivoted on a journal attached to one of a side wall of the module and one of said vertical partitions, said lever being pivoted between an unlocked position and a locked position, and
- said one of said vertical partitions and said side wall comprises a fixed locking member projecting towards an interior portion of the compartment, the locking lever cooperating with the locking member as a cam up to the locked position wherein said journal is exclusively mounted to one of a single side of the modules and a side of the vertical partitions.

12. Automation device, comprising:
- a chassis which has horizontal and vertical walls and which delimits an internal volume fitted with rectilinear guide members,
- a plurality of functional modules each having a locking member provided at a rear portion with a connector and at a front portion with a terminal block, each module being insertable into the internal volume of the chassis by said guide members and immobilized in a connection position by said locking member, wherein:
- the internal volume of the chassis is divided into compartments separated by vertical partitions and each accommodating at least one of said modules,
- the number and disposition of the guide members are determined for undifferentiated insertion of one of a single functional module and two half-height functional modules into each compartment, and
- each vertical partition comprises two locking members projecting towards the interior of the compartment and cooperating with a respective locking lever mounted on a respective module wherein said journal is exclusively mounted to one of a single side of the modules and a side of the vertical partitions.

* * * * *